United States Patent
Liu et al.

(10) Patent No.: US 10,147,800 B2
(45) Date of Patent: Dec. 4, 2018

(54) METHOD OF FABRICATING A TRANSISTOR WITH REDUCED HOT CARRIER INJECTION EFFECTS

(71) Applicant: UNITED MICROELECTRONICS CORP., Hsin-Chu (TW)

(72) Inventors: Kuan-Liang Liu, Hsinchu County (TW); Shih-Yin Hsiao, Chiayi County (TW); Ching-Chung Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 24 days.

(21) Appl. No.: 15/047,644

(22) Filed: Feb. 19, 2016

(65) Prior Publication Data
US 2017/0243950 A1    Aug. 24, 2017

(51) Int. Cl.
*H01L 29/66* (2006.01)
*H01L 21/265* (2006.01)
*H01L 29/78* (2006.01)

(52) U.S. Cl.
CPC .. *H01L 29/66598* (2013.01); *H01L 21/26513* (2013.01); *H01L 29/7833* (2013.01)

(58) Field of Classification Search
CPC ................................................ H01L 29/66871
See application file for complete search history.

(56) References Cited

U.S. PATENT DOCUMENTS

| | | | | |
|---|---|---|---|---|
| 6,344,396 B1 * | 2/2002 | Ishida | ................. | H01L 29/6653 257/E21.427 |
| 2002/0102785 A1 | 8/2002 | Ho | | |
| 2003/0211689 A1 * | 11/2003 | Yoo | ................... | H01L 21/28273 438/257 |
| 2014/0197487 A1 * | 7/2014 | Cascino | ............ | H01L 29/41766 257/337 |

* cited by examiner

*Primary Examiner* — Mohammad Choudhry
(74) *Attorney, Agent, or Firm* — Winston Hsu

(57) ABSTRACT

A method of fabricating a transistor with reduced hot carrier injection effects includes providing a substrate covered by a gate material layer. Later, the gate material layer is patterned into a gate electrode. Then, a mask layer is formed to cover part of the gate electrode and expose two ends of the gate electrode. Finally, a first implantation process is performed to implant dopants through the exposed two ends of the gate electrode into the substrate directly under the gate electrode to form two LDD regions by taking the mask layer as a mask.

14 Claims, 5 Drawing Sheets

US 10,147,800 B2

METHOD OF FABRICATING A TRANSISTOR WITH REDUCED HOT CARRIER INJECTION EFFECTS

BACKGROUND OF THE INVENTION

1. Field of the Invention

The present invention relates to a method of fabricating a transistor with reduced hot carrier hot injection effects, and more particularly to a method of fabricating a transistor which has enough overlaps between the lightly doped regions and the gate electrode.

2. Description of the Prior Art

As semiconductor device technology has continued to advance, and dimensions of semiconductor devices have continued to decrease, several effects which degrade the performance of transistors have become more pronounced.

One of the most significant contributors to device failure is hot carrier injection. Hot carrier injection is an effect where high-energy charges are injected into the gate dielectric of a transistor and may become lodged in the dielectric. Trapped charges tend to accumulate over time and affect the turn-on voltage and drain current of transistors, and may eventually lead to failure of the device. Consequently, there is a need to develop a transistor with reduced hot carrier injection effect.

SUMMARY OF THE INVENTION

According to a preferred embodiment of the present invention, a method of fabricating a transistor with reduced hot carrier injection effects includes providing a substrate covered by a gate material layer. Later, the gate material layer is patterned into a gate electrode. Then, a mask layer is formed to cover part of the gate electrode and expose two ends of the gate electrode. Finally, a first implantation process is performed to implant dopants through the exposed two ends of the gate electrode into the substrate directly under the gate electrode to form two LDD regions by taking the mask layer as a mask.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 depict a method of fabricating a transistor with reduced hot carrier injection effects according to a first preferred embodiment of the present invention, wherein:

FIG. 1 depicts a stage of providing a substrate with STIs;

FIG. 2 is a fabricating stage following FIG. 1;

FIG. 4 is a fabricating stage following FIG. 3B.

FIG. 1, FIG. 2 and FIG. 6 depict a method of fabricating a transistor with reduced hot carrier injection effects according to a second preferred embodiment of the present invention, wherein:

FIG. 1 depicts a stage of providing a substrate with STIs;

FIG. 2 is a fabricating stage following FIG. 1; and

FIG. 6 is a fabricating stage following FIG. 2.

FIG. 7, FIG. 8A and FIG. 8B depict a method of fabricating a transistor with reduced hot carrier injection effects according to a third preferred embodiment of the present invention, wherein:

FIG. 7 depicts a stage of providing a substrate covered by a gate electric layer, a gate electrode and a cap layer;

FIG. 8A is a top view of the fabricating stage following FIG. 7; and

FIG. 8B is a sectional view taken along line BB' in FIG. 8A.

DETAILED DESCRIPTION

Figure 1:
Figure 1:
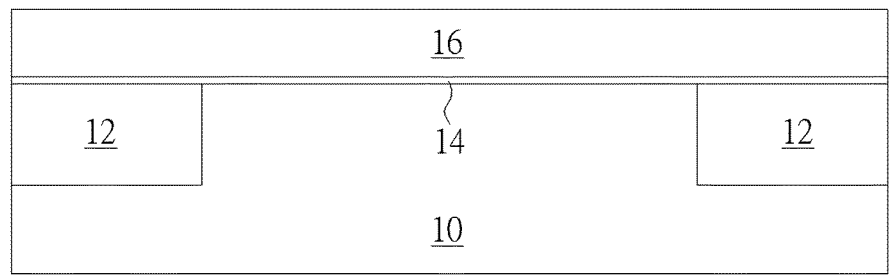
Figure 2:
Figure 2:
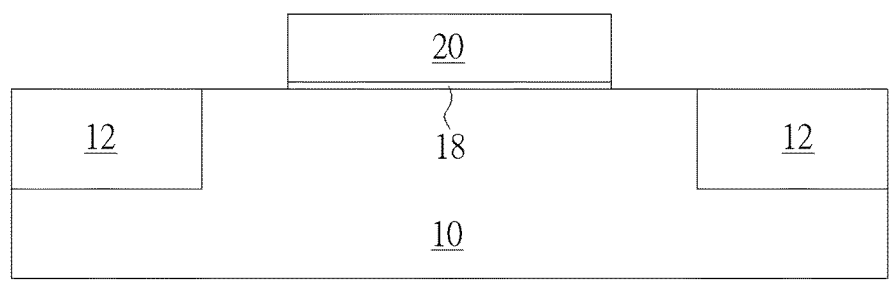
Figure 3A:
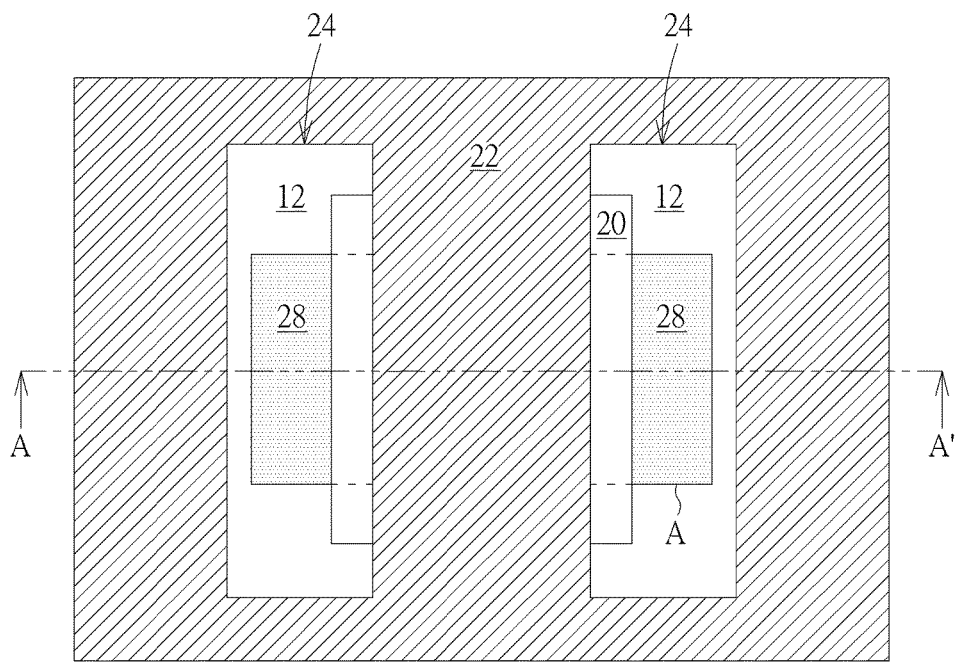
FIG. 3A is a top view of the fabricating stage following FIG. 2.
Figure 3B:
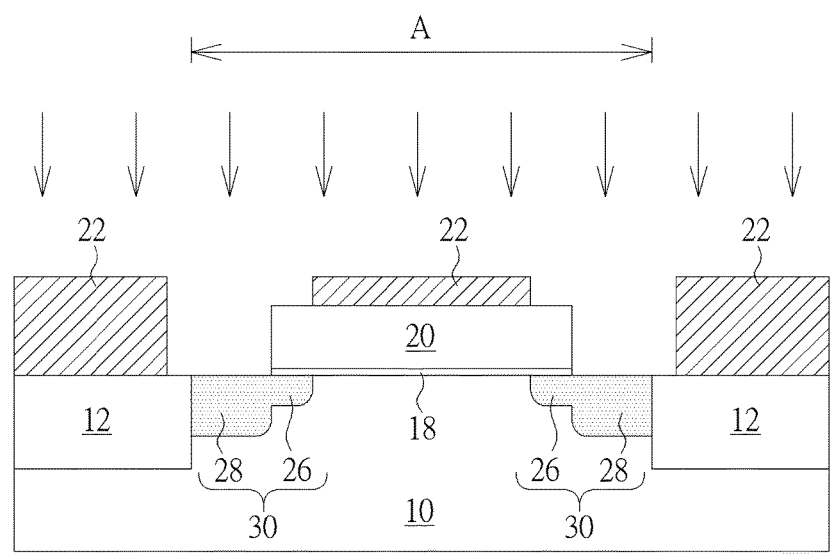
FIG. 3B is a sectional view taken along line AA' in FIG. 3A.

FIG. 1 to FIG. 4 depict a method of fabricating a transistor with reduced hot carrier injection effects according to a first preferred embodiment of the present invention, wherein FIG. 3A is a top view of the fabricating stage following FIG. 2, and FIG. 3B is a sectional view taken along line AA' in FIG. 3A.

As shown in FIG. 1, a substrate 10 is provided. At least one shallow trench isolation (STI) 12 is embedded within the substrate 10. In other embodiment, the STI 12 can be replaced by other isolation structures such as a field oxide or a deep trench isolation. The STI 12 defines an active area A on the substrate 10. The substrate 10 may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. The STI 12 is made of silicon oxide. The substrate 10 may include a fin or be a planar substrate. A dielectric layer 14 is formed on the substrate 10. The dielectric layer 14 may be selected from insulating materials such as silicon oxide, silicon nitride, silicon carbide nitride, silicon oxynitride, high-k dielectrics or any combination thereof. Then, a gate material layer 16 is formed to cover the dielectric layer 14. The gate material layer 16 may include polysilicon, metal, silicide or a combination thereof. As shown in FIG. 2, the gate material layer 16 and the dielectric layer 14 are patterned to form a gate electrode 20 and a gate dielectric layer 18 within the active area A. As shown in FIG. 3A and FIG. 3B, a mask layer 22 is formed to cover part of the gate electrode 20 and expose two ends of the gate electrode 20. In more detail, the mask layer 22 preferably covers the middle of the gate electrode 20. The mask layer 22 further covers part of the substrate 10 and exposes the substrate 10 at two sides of the gate electrode 20. The STI 12 at two sides of the gate electrode 20 is also exposed through the mask layer 22. That is, part of the active area A, and part of the STI 12 are exposed through the mask layer 22. In other words, the mask layer 22 has two openings 24, and the two ends of the gate electrode 20, the substrate 10 and the STI 12 at two sides of the gate electrode 20 are exposed through the openings 24. The steps of fabricating the mask layer 22 may include forming a photoresist layer (not shown) covering the substrate 10, the STI 12 and the gate electrode 20. Later, the photoresist layer is patterned to form the mask layer 22 with two openings 24.

Continue to refer to FIG. 3A and FIG. 3B. A first implantation process is performed to implant dopants through the exposed two ends of the gate electrode 20 into the substrate 10 directly under the gate electrode 20 by taking the mask layer 22 as a mask. During the first implantation process, the dopants are also directly implanted into the substrate 10 exposed through the mask layer 22 and not covered by the gate electrode 20. The dopants penetrate two ends of the gate electrode 20 as well as the dielectric layer 18 below the two ends of the gate electrode 20, and enter the substrate 10 to form two shallower lightly doped regions 26 directly below the gate electrode 20. The dopants implanted directly into the substrate 10 exposed through the mask layer 22 and not covered by the gate electrode 20 form two deeper lightly doped regions 28. The shallower lightly doped regions 26 and deeper lightly doped regions 28 form lightly doped regions 30.

Figure 4:
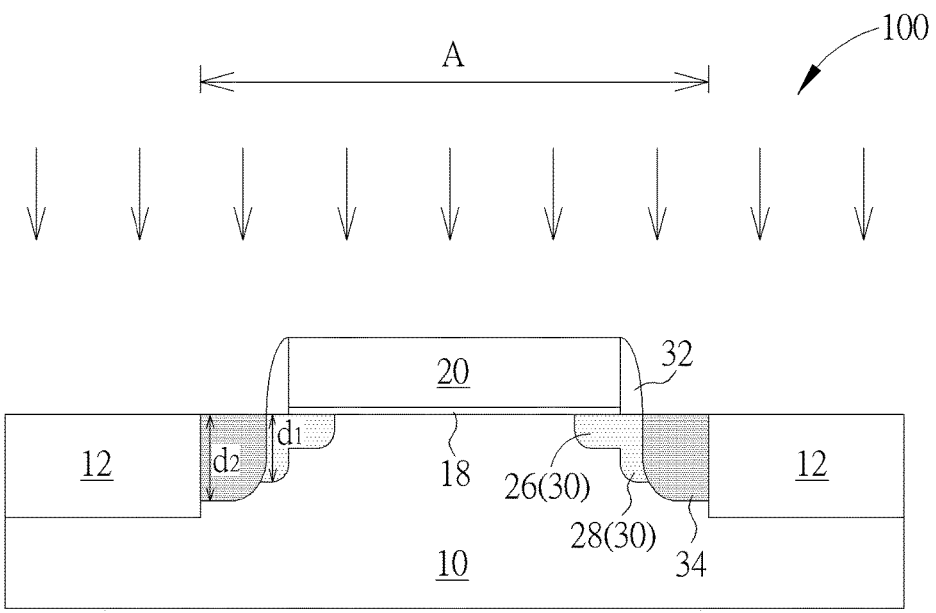

FIG. 4 continues from FIG. 3B. As shown in FIG. 4, the mask layer 22 is removed. Then, two spacers 32 are formed at two sides of the gate electrode 20. Subsequently, a second implantation process is performed to implant dopants into the substrate 10 by taking the gate electrode 20 and the spacers 32 as a mask so as to form source/drain doped regions 34 in the substrate 10 at two sides of the gate electrode 20. At this point, a transistor 100 with reduced hot carrier injection effects of the instant application is completed. During the second implantation process, the dopants do not penetrate the gate electrode 20. Furthermore, a depth $d_2$ of each of the source/drain doped regions 34 is larger than a depth $d_1$ of each of the lightly doped regions 30. Therefore, the bottoms of the shallower lightly doped regions 26, the bottom of the deeper lightly doped regions 28, and the bottoms of the source/drain doped regions 34 form a wavelike profile declining away from the gate electrode 20. The first and second implantation process includes implanting n-type or p-type dopants into the substrate 10. The transistor 100 of the instant application can usually sustain voltage above 3.3 volts.

Figure 5:
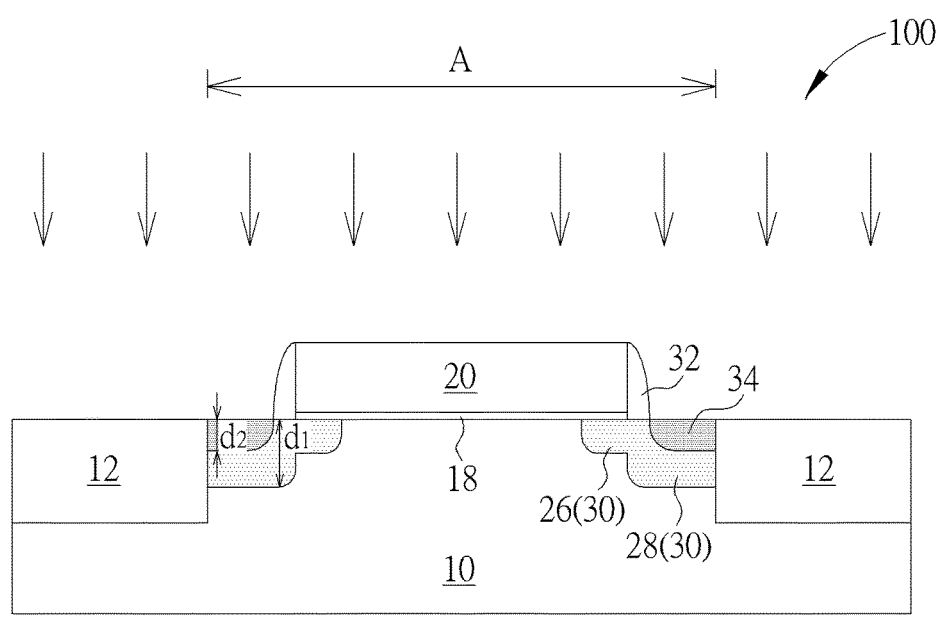
FIG. 5 depicts a modification of transistor with reduced hot carrier injection effects.

FIG. 5 depicts a modification of the first preferred embodiment showing a transistor with reduced hot carrier injection effects, wherein elements which are substantially the same as those in FIG. are denoted by the same reference numerals; an accompanying explanation is therefore omitted. FIG. 5 continues from FIG. 3B. As shown in FIG. 5, after the mask layer 22 is removed, two spacers 32 are formed at two sides of the gate electrode 20. Then, a second implantation process is performed to form source/drain doped regions 34. The difference between this modification and the first preferred embodiment is that the implantation energy of the second implantation process in the modification is smaller than the implantation energy of the first implantation process in the first preferred embodiment. Therefore, in FIG. 5, a depth $d_2$ of each of the source/drain doped regions 34 is smaller than a depth $d_1$ of each of the lightly doped regions 30. In other words, in FIG. 5, one of the lightly doped regions 30 entirely overlaps one of the source/drain doped regions 34.

Figure 6:
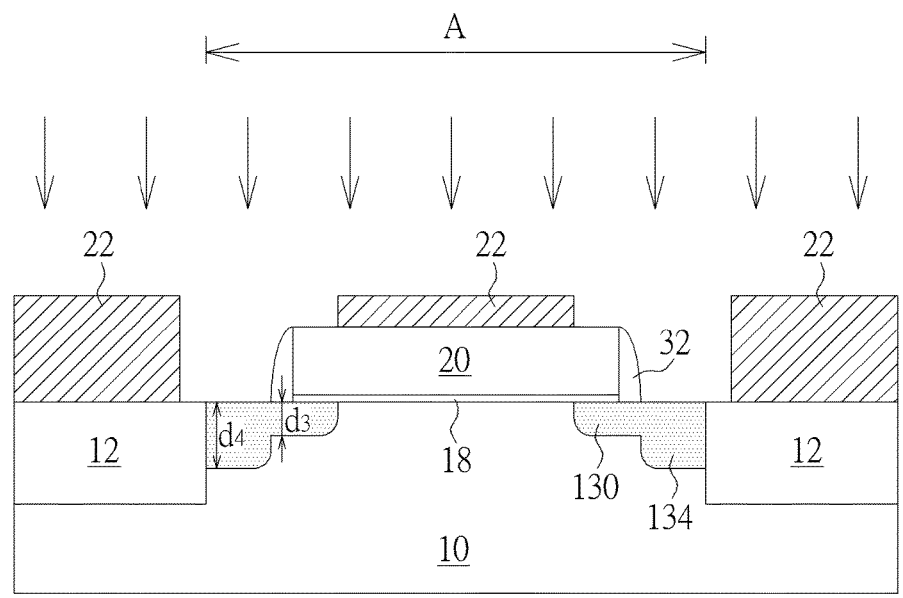

FIG. 1, FIG. 2 and FIG. 6 depict a method of fabricating a transistor with reduced hot carrier injection effects according to a second preferred embodiment of the present invention, wherein elements which are substantially the same as those in the first preferred embodiment are denoted by the same reference numerals; an accompanying explanation is therefore omitted. As shown in FIG. 1, a substrate 10 is provided. At least one STI 12 is embedded within the substrate 10, and an active area A is defined by the STI 12. Then, a dielectric layer 14 and a gate material layer 16 are formed to cover the substrate 10. As shown in FIG. 2, the dielectric layer 14 and the gate material layer 16 are patterned to form a gate dielectric layer 18 and a gate electrode 20. As shown in FIG. 6, two spacers 32 are formed at two sides of the gate electrode 20. Then, a mask layer 22 is formed to cover part of the gate electrode 20 and expose two ends of the gate electrode 20 and the spacers 32. The mask layer 22 further covers part of the substrate 10 and exposes the substrate 10 at two sides of the gate electrode 20. The position and the fabricating method of the mask layer 22 in the second preferred embodiment is the same as in the first preferred embodiment; a detailed description is therefore omitted. Later, a first implantation process is performed to implant dopants through the exposed two ends of the gate electrode 20 and the spacers 32 into the substrate 10, and implant dopants directly into the substrate 10 at two sides of the gate electrode 20 by taking the mask layer 22 as a mask. After the first implantation process, the dopants in the substrate 10 directly under the electrode 20 and the spacers 32 form lightly doped regions 130. The dopants in the substrate 10 next to the gate electrode 20 which are not covered by the spacers 32 form source/drain doped regions 134. Depths $d_4$ of the source/drain doped regions 134 are larger than the depths $d_3$ of the lightly doped regions 130. The difference between the first preferred embodiment and the second preferred embodiment is that, in the second preferred embodiment, the fabricating steps of the lightly doped regions 130 and the source/drain doped regions 134 are completed simultaneously in a single implantation process, and the lightly doped regions 130 and the source/drain doped regions 134 are formed after the spacers 32 are formed. The lightly doped regions 30 and the source/drain doped regions 34 of the first preferred embodiment are formed by two implantation processes, wherein the lightly doped regions 30 are formed before the spacers 32 are formed, and the source/drain doped regions 34 are formed after the spacers 32 are formed.

Figure 7:
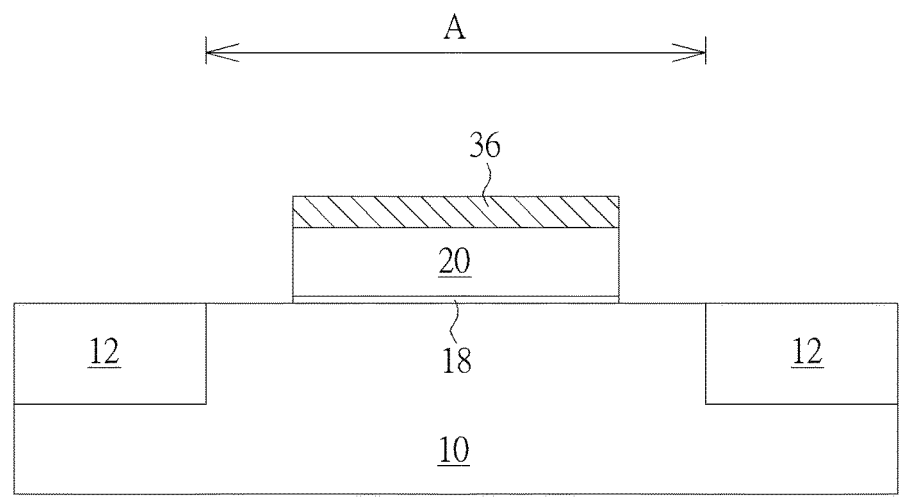
Figure 8A:
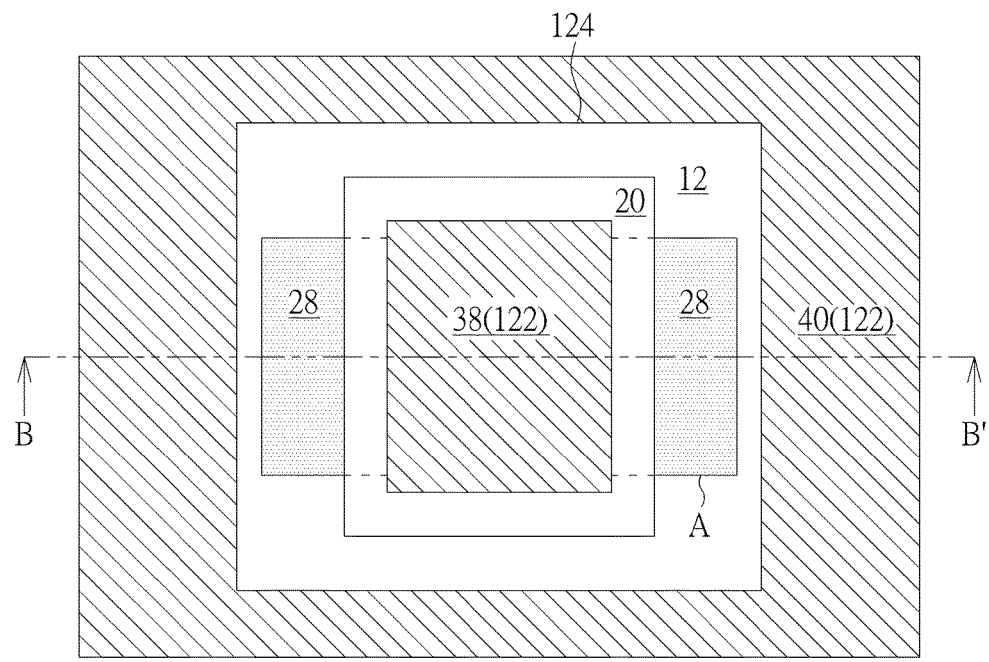
Figure 8B:
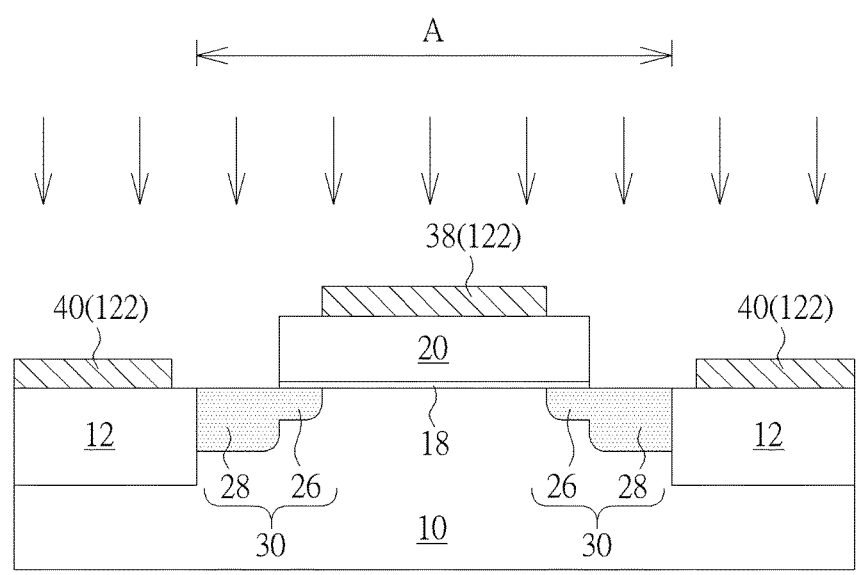

FIG. 7, FIG. 8A and FIG. 8B depict a method of fabricating a transistor with reduced hot carrier injection effects according to a third preferred embodiment of the present invention, wherein elements which are substantially the same as those in the first preferred embodiment are denoted by the same reference numerals. Furthermore, FIG. 8A is a top view of the fabricating stage following FIG. 7, and FIG. 8B is a sectional view taken along line BB' in FIG. 8A. The third preferred embodiment is a modification of the first preferred embodiment. The difference between the first preferred embodiment and the third embodiment is that the mask layer on the middle of the gate electrode in the third preferred embodiment is formed by a cap layer.

As shown in FIG. 7, a substrate 10 is provided. At least one STI 12 is embedded within the substrate. An active area A is defined by the STI 12. Then, a dielectric layer (not shown), a gate material layer (not shown), and a cap material layer (not shown) are formed in sequence to cover the substrate 10. The dielectric layer, the gate material layer and the cap material layer are patterned to form a gate dielectric layer 18, a gate electrode 20, and a cap layer 36.

As shown in FIG. 8A and FIG. 8B, the cap layer 36 is trimmed to shorten its size in all directions, and the trimmed cap layer 36 becomes a first mask layer 38. The first mask layer 38 covers part of the gate electrode 20 and exposes two ends of the gate electrode 20. In detail, the first mask layer 38 covers the middle of the gate electrode 20. Then, a photoresist layer 40 is formed to cover the substrate 10 and part of the STI 12. The photoresist layer 40 has an opening 124. The first mask layer 38, the gate electrode 10, and the substrate 10 at two sides of the gate electrode 20 are exposed through the opening 124. That is, the active area A and part of the STI 12 are exposed through the opening 124. The photoresist layer 40 may cover other active areas on the substrate 10. The covered active areas may have a conductive type different from that of the active area A. The first mask layer 38 and the photoresist layer 40 form a mask layer 122.

Later, lightly doped regions 30 are formed by a first implantation process to implant dopants through the exposed two ends of the gate electrode 20 into the substrate 10 and implant dopants directly into the substrate 10 at two sides of the gate electrode 20 by taking the mask layer 122 as a mask. The position of the lightly doped regions 30 in the third preferred embodiment is the same as in the first preferred embodiment. Please refer to the first preferred embodiment for details.

Subsequently, the mask layer 122 is removed. Then, source/drain regions can be formed by the same steps as in the first preferred embodiment, and as well as the modification of the first preferred embodiment in FIG. 5.

The lightly doped drain regions 30 and the source/drain regions in the third embodiment can also be formed by the steps described in the second preferred embodiment. For example, after the cap layer 36, the gate electrode 20, and the dielectric layer 18 are formed, two spacers can be formed at two sides of the gate electrode 20. Then, the cap layer 36 can be trimmed to become the first mask layer. After that, a photoresist layer is formed to cover the substrate 10 and part of the STI 12. The first mask layer and the photoresist layer form a mask layer. Subsequently, the lightly doped drain regions and the source/drain regions can be formed by taking the mask layer as a mask in a single implantation process as described in the second preferred embodiment.

The hot carrier injection effects can be prevented by enough overlap between the lightly doped regions and the gate electrode. The conventional method can only use a thermal process to diffuse the lightly doped regions and make the lightly doped regions overlap with the gate electrode. With the shrinkage of the semiconductor device, the thermal budget becomes smaller. Therefore, sufficient overlap between the lightly doped regions and the gate electrode can no longer be achieved by the thermal process alone. The present invention utilizes the mask layer to cover part of the gate electrode and let two ends of the gate electrode be penetrated by dopants. Therefore, dopants can be implanted into the substrate directly below the gate electrode. In this way, the lightly doped regions can overlap with the gate electrode to a desired range, and the hot carrier injection effects can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a transistor with reduced hot carrier injection effects, comprising:
   providing a substrate covered by a gate material layer;
   patterning the gate material layer into a gate electrode;
   forming a mask layer covering part of the gate electrode and exposing two ends of the gate electrode; and
   performing a first implantation process to implant dopants to form two lightly doped regions at two sides of the gate electrode by taking the mask layer as a mask, wherein the dopants penetrate the exposed two ends of the gate electrode and enter the substrate directly under the gate electrode, and an edge of one of the lightly doped regions is aligned with an edge of the mask layer, wherein each lightly doped region comprises a shallower lightly doped region and a deeper lightly doped region, and the shallower lightly doped region is disposed entirely directly under the gate electrode.

2. The method of fabricating a transistor with reduced hot carrier injection effects of claim 1, wherein the method of fabricating the two lightly doped regions further comprises:
   when implanting dopants through the exposed two ends of the gate electrode, the dopants are also implanted into the substrate not covered by the gate electrode or not covered by the mask layer.

3. The method of fabricating a transistor with reduced hot carrier injection effects of claim 2, further comprising:
   after forming the lightly doped regions, removing the mask layer;
   forming two spacers at two sides of the gate electrode; and
   performing a second implantation process to implant dopants into the substrate by taking the gate electrode and the spacers as a mask so as to form source/drain doped regions in the substrate at two sides of the gate electrode.

4. The method of fabricating a transistor with reduced hot carrier injection effects of claim 3, wherein one of the source/drain doped regions entirely overlaps one of the lightly doped regions.

5. The method of fabricating a transistor with reduced hot carrier injection effects of claim 4, wherein a depth of each of the source/drain doped regions is larger than a depth of each of the lightly doped regions.

6. The method of fabricating a transistor with reduced hot carrier injection effects of claim 4, wherein a depth of each of the source/drain doped regions is smaller than a depth of each of the lightly doped regions.

7. The method of fabricating a transistor with reduced hot carrier injection effects of claim 1, further comprising:
   before performing the first implantation process and forming the mask layer, forming two spacers at two sides of the gate electrode.

8. The method of fabricating a transistor with reduced hot carrier injection effects of claim 7, wherein the first implantation process further comprises:
   implanting the dopants into the substrate not covered by the gate electrode and the spacers by taking the mask layer as a mask so as to form source/drain doped regions in the substrate at two sides of the gate electrode.

9. The method of fabricating a transistor with reduced hot carrier injection effects of claim 7, further comprising:
   removing the mask layer after the first implantation process.

10. The method of fabricating a transistor with reduced hot carrier injection effects of claim 1, wherein the steps of fabricating the mask layer comprises:
    forming a photoresist layer covering the substrate and the gate electrode; and
    patterning the photoresist layer to form the mask layer, wherein the mask layer exposes two ends of the gate electrode and the substrate at two side of the gate electrode.

11. The method of fabricating a transistor with reduced hot carrier injection effects of claim 1, wherein the steps of fabricating the mask layer comprises:
    before patterning the gate material layer, forming a cap material layer covering the gate material layer;
    patterning the gate material layer and the cap material layer simultaneously so as to form the gate electrode and a cap layer covering the gate electrode; and
    trimming the cap layer to form the mask layer, wherein the mask layer covers the middle of the gate electrode and exposes two ends of the gate electrode.

12. A method of fabricating a transistor with reduced hot carrier injection effects, comprising:
   providing a substrate covered by a gate material layer;
   patterning the gate material layer into a gate electrode;
   forming a mask layer covering part of the gate electrode and exposing two ends of the gate electrode; and
   performing a first implantation process to implant dopants through the exposed two ends of the gate electrode into the substrate directly under the gate electrode to form two lightly doped regions by taking the mask layer as a mask, wherein each of the lightly doped regions comprises a shallower lightly doped region and a deeper lightly doped region, and the shallower lightly doped region and the deeper lightly doped region form a step profile, and an edge of the shallower lightly doped region is aligned with an edge of the mask layer, wherein the shallower lightly doped region and the deeper lightly doped region forming the step profile are made in a single implantation step.

13. The method of fabricating a transistor with reduced hot carrier injection effects of claim 12, wherein the shallower lightly doped region is disposed entirely directly under the gate electrode.

14. The method of fabricating a transistor with reduced hot carrier injection effects of claim 1, wherein the shallower lightly doped region and the deeper lightly doped region forming a step profile and the shallower lightly doped region and the deeper lightly doped region are made in a single implantation step.

* * * * *